United States Patent
Bour et al.

(10) Patent No.: US 9,318,331 B2
(45) Date of Patent: Apr. 19, 2016

(54) METHOD AND SYSTEM FOR DIFFUSION AND IMPLANTATION IN GALLIUM NITRIDE BASED DEVICES

(71) Applicant: Avogy, Inc., San Jose, CA (US)

(72) Inventors: David P. Bour, Cupertino, CA (US); Richard J. Brown, Los Gatos, CA (US); Isik C. Kizilyalli, San Francisco, CA (US); Thomas R. Prunty, Santa Clara, CA (US); Linda Romano, Sunnyvale, CA (US); Andrew P. Edwards, San Jose, CA (US); Hui Nie, Cupertino, CA (US); Mahdan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/498,916

(22) Filed: Sep. 26, 2014

(65) Prior Publication Data

US 2015/0017792 A1    Jan. 15, 2015

Related U.S. Application Data (63) Continuation of application No. 13/240,877, filed on Sep. 22, 2011, now Pat. No. 8,846,482.

(51) Int. Cl.
    *H01L 21/42*    (2006.01)
    *H01L 21/265*    (2006.01)
    (Continued)

(52) U.S. Cl.
    CPC ...... *H01L 21/26546* (2013.01); *H01L 21/0332* (2013.01); *H01L 21/2258* (2013.01); *H01L 21/266* (2013.01); *H01L 21/3245* (2013.01); *H01L 29/2003* (2013.01); *H01L 29/207* (2013.01); *H01L 29/66136* (2013.01);
    (Continued)

(58) Field of Classification Search
    CPC ..... H01L 21/8222; H01L 21/42; H01L 21/20; H01L 33/00; H01L 29/12; H01L 29/80; H01L 21/02; H01L 29/66; H01L 21/331; H01L 29/737
    USPC ......... 438/328, 141, 520, 518, 522, 523, 602, 438/604, 312, 135, 513, 478, 186; 257/E21.382, E21.473, E21.09, 103, 257/613, E29.068, E33.03, 279, 256
    See application file for complete search history.

(56) References Cited

U.S. PATENT DOCUMENTS

| 5,866,925 | A * | 2/1999 | Zolper | H01L 21/2656 257/256 |
| 6,432,788 | B1 * | 8/2002 | Maruska | H01L 29/66318 257/E21.387 |

(Continued)

*Primary Examiner* — David Vu
*Assistant Examiner* — Mouloucoulaye Inoussa
(74) *Attorney, Agent, or Firm* — Kilpatrick Townsend & Stockton LLP (57) ABSTRACT

A method of forming a doped region in a III-nitride substrate includes providing the III-nitride substrate and forming a masking layer having a predetermined pattern and coupled to a portion of the III-nitride substrate. The III-nitride substrate is characterized by a first conductivity type and the predetermined pattern defines exposed regions of the III-nitride substrate. The method also includes heating the III-nitride substrate to a predetermined temperature and placing a dual-precursor gas adjacent the exposed regions of the III-nitride substrate. The dual-precursor gas includes a nitrogen source and a dopant source. The method further includes maintaining the predetermined temperature for a predetermined time period, forming p-type III-nitride regions adjacent the exposed regions of the III-nitride substrate, and removing the masking layer.

20 Claims, 6 Drawing Sheets

(51) Int. Cl.
  *H01L 29/207* (2006.01)
  *H01L 21/225* (2006.01)
  *H01L 29/808* (2006.01)
  *H01L 29/20* (2006.01)
  *H01L 29/66* (2006.01)
  *H01L 29/861* (2006.01)
  *H01L 29/872* (2006.01)
  *H01L 21/033* (2006.01)
  *H01L 21/266* (2006.01)
  *H01L 21/324* (2006.01)

(52) U.S. Cl.
  CPC ...... *H01L29/66143* (2013.01); *H01L 29/8083* (2013.01); *H01L 29/861* (2013.01); *H01L 29/872* (2013.01)

(56) References Cited

U.S. PATENT DOCUMENTS

2008/0050889 A1* 2/2008 Bour et al. .................... 438/479
2008/0124851 A1* 5/2008 Zhang ................. H01L 29/7787
  438/172

* cited by examiner

METHOD AND SYSTEM FOR DIFFUSION AND IMPLANTATION IN GALLIUM NITRIDE BASED DEVICES

CROSS-REFERENCES TO RELATED APPLICATIONS

This application is a continuation of U.S. patent application Ser. No. 13/240,877, filed on Sep. 22, 2011, entitled "METHOD AND SYSTEM FOR DIFFUSION AND IMPLANTATION IN GALLIUM NITRIDE BASED DEVICES," the disclosure of which is hereby incorporated by reference in its entirety for all purposes.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for fabricating electronic devices using implantation and/or diffusion processes. Merely by way of example, the invention has been applied to GaN-based diodes and transistors with implanted and diffused p-n junctions. The methods and techniques can be applied to a variety of compound semiconductor systems including diodes and transistors.

According to an embodiment of the present invention, a method of forming a doped region in a III-nitride substrate is provided. The method includes providing the III-nitride substrate. The III-nitride substrate is characterized by a first conductivity type. The method also includes forming a masking layer having a predetermined pattern and coupled to a portion of the III-nitride substrate. The predetermined pattern defines exposed regions of the III-nitride substrate. The method further includes heating the III-nitride substrate to a predetermined temperature and placing a dual-precursor gas adjacent the exposed regions of the III-nitride substrate. The dual-precursor gas includes a nitrogen source and a dopant source. Additionally, the method includes maintaining the predetermined temperature for a predetermined time period, forming p-type III-nitride regions adjacent the exposed regions of the III-nitride substrate, and removing the masking layer.

According to another embodiment of the present invention, a method of forming a doped region in a III-nitride substrate is provided. The method includes providing the III-nitride substrate and forming a masking layer having a predetermined pattern and coupled to a portion of the III-nitride substrate. The III-nitride substrate is characterized by a first conductivity type and the predetermined pattern defines predetermined portions of the III-nitride substrate. The method also includes implanting a dopant into the predetermined portions of the III-nitride substrate. The dopant is characterized by a second conductivity type. The method further includes placing the III-nitride substrate in a chamber, forming a nitrogen-containing ambient environment in the chamber, heating the III-nitride substrate to a predetermined temperature, maintaining the predetermined temperature for a predetermined time period, and removing the masking layer.

According to a specific embodiment of the present invention, an electronic device is provided. The electronic device includes a III-nitride substrate and an first ohmic contact electrically coupled to the III-nitride substrate. The electronic device also includes a p-type region coupled to the III-nitride substrate. The p-type region comprises a dopant profile associated with implantation and anneal processes and has an activation level greater than or equal to $1 \times 10^{16}$ cm$^{-3}$. The electronic device further includes a second ohmic contact electrically coupled to the p-type region.

Numerous benefits are achieved by way of the present invention over conventional techniques. For example, embodiments of the present invention provide devices with lower capacitance and lower leakage current in comparison with conventional devices. Embodiments of the present invention provide fabrication techniques that overcome the limitations associated with conventional techniques, enabling the fabrication of a wide variety of high power electronic devices. These and other embodiments of the invention along with many of its advantages and features are described in more detail in conjunction with the text below and attached figures.

DETAILED DESCRIPTION OF SPECIFIC EMBODIMENTS

Embodiments of the present invention relate to electronic devices. More specifically, the present invention relates to methods and systems for fabricating electronic devices using implantation and/or diffusion processes. Merely by way of example, the invention has been applied to GaN-based diodes and transistors with implanted and diffused p-n junctions. The methods and techniques can be applied to a variety of compound semiconductor systems including diodes and transistors.

Some III-nitride devices form p-n junctions during the epitaxial growth process as materials with differing conductivity types are epitaxially grown. This can be achieved by introducing a precursor of a p-type dopant species during growth of a layer immediately over the surface of an n-type layer, providing an interface/junction that is substantially planar. The performance and reliability of electronic and optoelectronic devices may be improved by the formation of lateral p-n junctions, however, the high temperatures utilized in some semiconductor doping processes, including diffusion or implantation, present difficult issues related to performing such semiconductor doping processes in III-nitride based materials including GaN. Thus, embodiments of the present invention provide diffusion and implantation doping processes that allow for the formation of lateral p-n junctions in III-nitride materials including GaN. Past attempts to diffuse and implant dopants into III-nitride materials have met with limited success because the high temperatures associated with diffusing and annealing implanted species have resulted in the decomposition of the III-nitride substrates, due, in part, to the high vapor pressure of the nitrogen components of the nitride materials.

As described more fully throughout the present specification, a number of fundamental device structures benefit from the processes provided by embodiments of the present invention. Just by way of example, devices that can benefit from the processes described herein include Schottky barrier diodes and p-n junction diodes, which are basic elements in power electronics. Both Schottky barrier diodes and p-n junction diodes are two-terminal devices. Additionally, three-terminal devices, including FETs, can benefit from the processed described herein.

Figure 1:
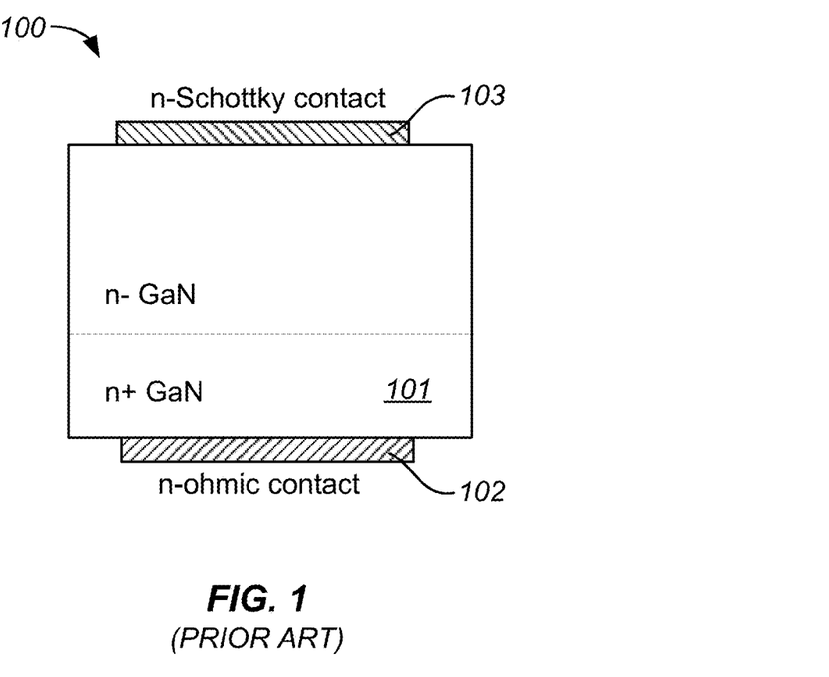
FIG. 1 is a simplified schematic diagram illustrating a conventional Schottky barrier diode.

FIG. 1 is a simplified schematic diagram illustrating a conventional Schottky barrier diode. The cross section illustrated in FIG. 1 shows a GaN Schottky barrier diode 100 with a heavily doped n-type substrate 101 including an n-type GaN region (typically an epitaxial layer) and an ohmic contact 102 connected to a first portion of the n-type GaN region. A Schottky contact 103 is formed in contact with a second portion of the lightly doped n-type GaN region 101 to form a Schottky barrier diode. As will be evident to one of skill in the art, the Schottky diode passes current in one direction (i.e., the forward direction) with low resistance and can sustain high voltages in reverse bias with little to no current flow in the reverse direction. As a rectifying device, the Schottky barrier diode can pass high currents with low resistance when operated in forward bias.

Figure 2:
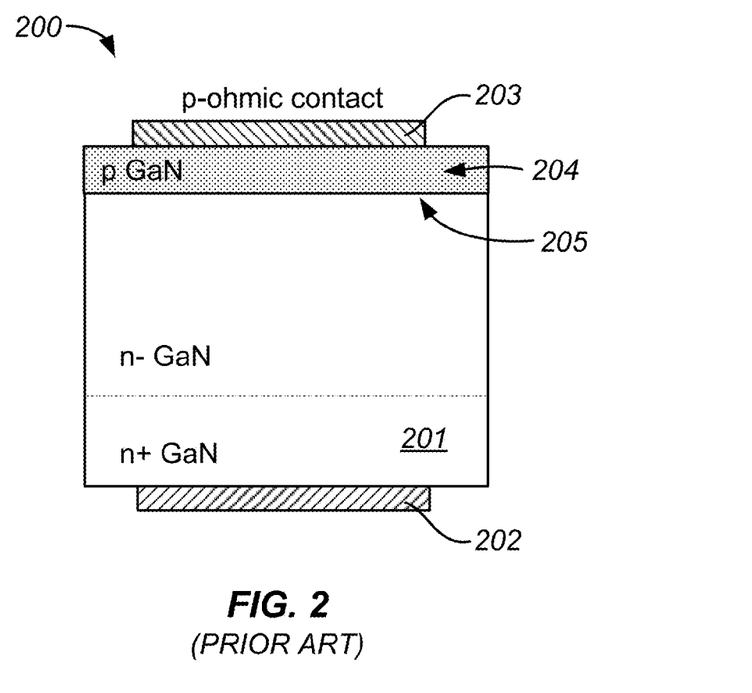
FIG. 2 is a simplified schematic diagram illustrating a conventional p-n junction diode.

FIG. 2 is a simplified schematic diagram illustrating a conventional p-n junction diode. The cross section illustrated in FIG. 2 shows a GaN p-n junction diode 200 with a heavily doped n-type substrate 201, an n-type doped GaN region, and an ohmic contact 202 connected to the n-type doped GaN region. The p-n junction diode 200 also includes a p-type doped GaN region 204 and an ohmic contact 203 connected to the p-type doped GaN region. The p-type doped GaN region 204 is typically a GaN layer that is epitaxially deposited over the n-type-doped GaN region 201. A p-n junction 205 is formed between the n-type and p-type regions. The rectifying behavior of the p-n junction diode is a consequence of the presence of the p-n junction 205.

Embodiments of the present invention provide techniques useful for performing diffusion processes used for the formation of lateral p-n junctions in GaN-based electronic devices. Conventionally, implantation in GaN-based materials has met with limited success because of the high temperatures (e.g., in the range of 900° C.-1400° C.) associated with activating the implanted species after implantation. Such high temperatures tend to decompose and destroy the GaN material. Thus, embodiments of the present invention provide methods and systems for diffusion and implantation/anneal processes for GaN-based materials not available using conventional techniques.

Figure 3A:
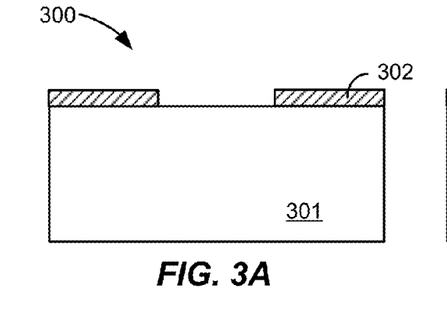
FIGS. 3A-3C are simplified process flow diagrams illustrating a vapor-phase diffusion process according to an embodiment of the present invention.
Figure 3B:
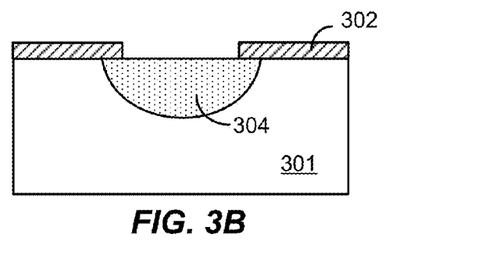
Figure 3C:
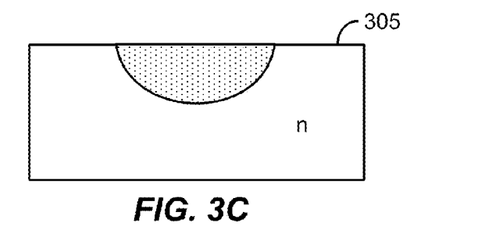

FIGS. 3A-3C are simplified process flow diagrams illustrating a vapor-phase diffusion process according to an embodiment of the present invention. Referring to FIG. 3A, an n-type doped GaN substrate 301 is partially covered with a lithographically-defined refractory mask 302 capable of withstanding the high temperatures and chemically aggressive environment of the diffusion process. The refractory mask, which can also be referred to as a diffusion mask, can be formed and patterned using a variety of refractory materials including $Si_3N_4$, AlN, $SiO_2$, refractory metals including titanium and tungsten, combinations thereof, and the like. The refractory mask is intended to be generally inert to high temperature processing and can be patterned (e.g., using photolithography and etching processes) to define areas for diffusion.

A dual-precursor ambient is utilized during the high temperature diffusion process, for example, an ambient including Bis(cyclopentadienyl)magnesium ($CP_2Mg$) and $NH_3$ as illustrated in FIG. 3A. The ammonia provides a source of active nitrogen species to counteract the decomposition of the GaN material during the diffusion process resulting from escape of nitrogen from the crystalline structure of the GaN at the high temperatures associated with diffusion. In some embodiments, the presence of a nitrogen-containing precursor in the dual-precursor ambient replaces nitrogen that would otherwise escape from the crystal lattice, preserving the stoichiometry of the film. The other precursor (e.g., $CP_2Mg$) provides an acceptor species (magnesium in this example) to provide a dopant species for doping the n-type substrate 301. The large concentration of dopant species (e.g., magnesium) in the vapor phase adjacent the substrate will result in diffusion of magnesium into the sample, creating p-type doped GaN regions 304, which will typically extend under the diffusion mask. In other embodiments, other acceptor species can be utilized including zinc, beryllium, carbon, calcium, or cadmium. The diffusion processes are typically performed at temperatures ranging from about 800° C. to about 1800° C.

Referring to FIG. 3B, after the diffusion process, a p-type doped GaN region 304 is formed. The masking layer is removed as illustrated in FIG. 3C, with a p-n junction formed between the n-type substrate 301 and the diffused p-type region 304. In some implementations, the p-n junction can be referred to as a lateral junction since near region 305, the interface between the p-type and n-type materials is substantially vertical, producing a lateral p-n junction.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIGS. 3A-3C, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The vapor-phase diffusion process illustrated in FIGS. 3A-3C illustrate the use of an n-type GaN substrate, however, the present invention is not limited to this particular configuration. In other embodiments, substrates with p-type doping are utilized to perform n-type diffusions. Additionally, embodiments can use materials having an opposite conductivity type to provide devices with different functionality. Thus, although some examples illustrate the use of an n-type GaN substrate, which could be doped with silicon, in other embodiments the techniques described herein are applicable to the use of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Figure 4A:
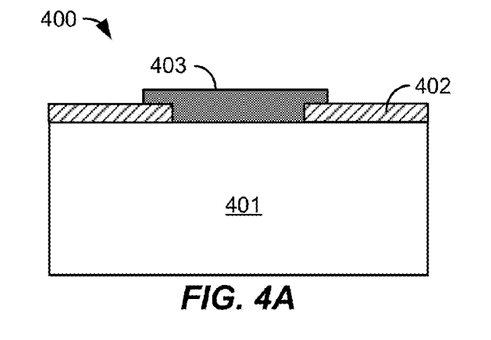
FIGS. 4A-4C are simplified process flow diagrams illustrating a solid-source diffusion process according to an embodiment of the present invention.
Figure 4B:
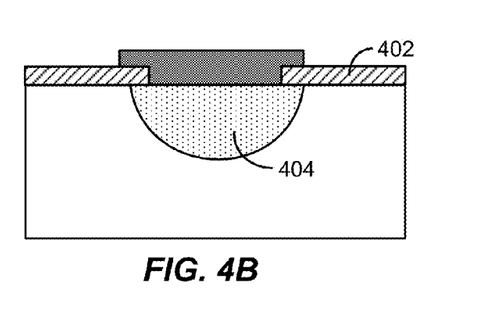
Figure 4C:
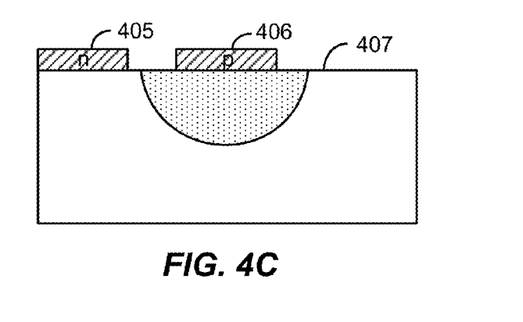

FIGS. 4A-4C are simplified process flow diagrams illustrating a solid-source diffusion process according to an embodiment of the present invention. The solid-source diffusion shares some similarities with the vapor-phase diffusion process described in relation to FIGS. 3A-3C and features some differences as well. As discussed in relation to FIG. 3A, an n-type doped GaN substrate 401 is utilized and a lithographically-defined refractory mask 402 is formed to defined exposed regions of the GaN substrate. A film containing a dopant species (e.g., a magnesium-containing film or a zinc-containing film for achieving p-type doping using magnesium or zinc acceptors) is formed adjacent the exposed regions of the GaN substrate. In some embodiments, the film is formed directly on the GaN substrate, whereas in other embodiments, one or more buffer, adhesion, or other suitable layers are formed between the GaN substrate and the film.

Referring to FIG. 4A, the dopant source is formed as a solid source 403 in contact with a surface of the substrate 401 over which an opening is formed in the masking layer, typically using a patterning process. Examples of solid sources useful for solid source diffusion include Zn, zinc oxide, acceptor-doped GaN, magnesium oxide, magnesium- or zinc-doped silicon nitride, or the like. In the illustrated embodiment, the solid-source diffusion source is separated from portions of the substrate using the diffusion mask 402 and the diffusion source overlaps some or all of the diffusion mask, although this is not required by the present invention. In other embodiments, the diffusion source is patterned to provide a solid diffusion source with a predetermined spatial pattern, for example, by patterning a solid magnesium-containing or zinc-containing diffusion source film or a film that is a source of other donors or acceptors. In some embodiments, an additional protective layer (not shown) is utilized depending on the source material used. The protective layer can serve to prevent decomposition of the diffusion source or the substrate material.

As illustrated in FIG. 4B, a diffusion process is used to drive the material from the diffusion source 403 into the bulk of the substrate 401 as illustrated by p-type region 404 (also referred to as a diffusion region). In the illustrated embodiment, a p-type dopant diffuses into an n-type region to form a p-type diffusion region, which will typically extend under the diffusion mask. In the illustrated embodiment, the diffusion region is formed in the shape of a hemisphere due to the isotropic nature of diffusion, but this is not required by embodiments of the present invention and other structural shapes can be realized. The diffusion process can be performed in a nitrogen-rich environment (e.g., in an ammonia environment) or the like to prevent or reduce the decomposition of the substrate and/or the diffusion source.

Referring to FIG. 4C, after the diffusion mask and the diffusion source are removed, a metal electrode 405 (e.g., an electrode suitable for making ohmic contact to an n-type semiconductor) is formed to contact the substrate 401 (e.g., an n-type GaN substrate) and a metal electrode 406 (e.g., an electrode suitable for making ohmic contact to a p-type semiconductor) is formed to contact to the diffusion region 412 (e.g., a p-type GaN region). Utilizing the process illustrated in FIGS. 4A-4C, a lateral p-n junction is formed by selective dopant (in this case an acceptor) diffusion using a solid source, providing an alternative to the process and structure illustrated in FIGS. 3A-3C. A diode is created by the addition of the n-electrode 405 and the p-electrode 406 on the surface of n-type and p-type GaN regions.

The inventors have determined that a number of acceptor species are suitable for diffusion in GaN including Mg, C, and Zn. Of these acceptor species, zinc is likely the fastest diffuser and zinc diffusion has been observed for growth of GaN on ZnO substrates and shallow zinc diffusions have been performed for improving ohmic contacts. Based on these observations and the strong visible emission from Si+Zn (donor+acceptor) co-doped LEDs, the inventors have determined that zinc is an active deep acceptor, making zinc diffusion a viable process for formation of p-n junctions in III-nitride material systems including GaN-based systems.

In the embodiment illustrated in FIGS. 4A-4C, diffusion is performed on a planar surface of substrate 401 to a sufficient depth to make a lateral p-n junction. In alternative embodiments, the solid-source diffusion may also be performed on a masked and trenched sample using a suitable dopant-containing film such as ZnO deposited conformally over the contoured surface. One of ordinary skill in the art would recognize many variations, modifications, and alternatives.

Figure 5A:
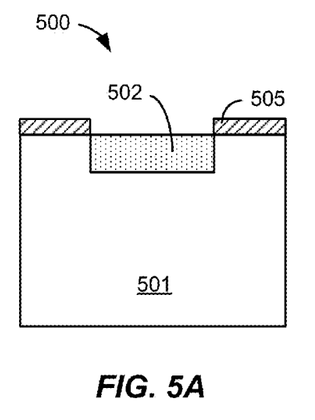
FIGS. 5A-5B are simplified process flow diagrams illustrating an ion implantation process according to an embodiment of the present invention.
Figure 5B:
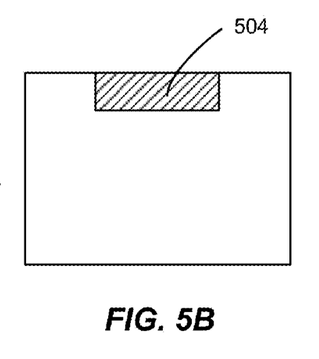

FIGS. 5A-5B are simplified process flow diagrams illustrating an ion implantation process according to an embodiment of the present invention. Referring to FIG. 5A, an n-type doped GaN substrate 501 is implanted with an acceptor species (e.g., zinc, magnesium, beryllium, or the like) in implanted region 502. An implant mask 505 is lithographically defined and utilized in the illustrated embodiment. Acceptor species implantation is performed at varying doses and energy levels until the desired implant profile has been achieved in the implanted region 502. The dopant profile in the implanted and annealed p-type region will likely differ from the profile achieved using diffusion or an etch/regrowth process. In some embodiments, magnesium can be implanted to depths ranging from about 0.05 µm to about 1 µm, for example, 0.3 µm. After implantation, the implant mask may be removed and an anneal process is utilized at an appropriate annealing temperature (e.g., 1400° C.) in an appropriate ambient atmosphere (e.g., ammonia or other nitrogen precursor) to form the annealed (and activated) p-type region 504 illustrated in FIG. 5B. The ambient containing some nitrogen precursor can reduce or prevent GaN dissociation. In some embodiments, the anneal is performed in a growth reactor (e.g., an MOCVD) using an ammonia ambient, which is readily available because ammonia is used as a precursor in the growth of GaN-based epitaxial layers. Lateral p-n junctions can thus be formed using the illustrated implantation process.

Utilizing embodiments of the present invention, methods and systems are provided that enable the fabrication of p-type regions with a dopant profile associated with implantation and anneal processes. The activation level of the dopant species can be greater than or equal to $1\times10^{16}$ cm$^{-3}$, for example, a dopant concentration in the p-type region greater than or equal to $1\times10^{18}$ cm$^{-3}$. The peak of the dopant profile can be positioned between 0.1 μm and 0.5 μm from the second ohmic contact.

Figure 6A:
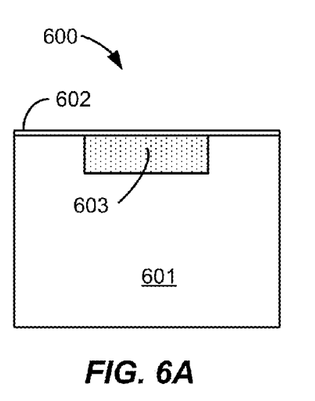
FIGS. 6A-6B are simplified process flow diagrams illustrating an ion implantation process using a sacrificial layer according to an embodiment of the present invention.

FIGS. 6A-6B are simplified process flow diagrams illustrating an ion implantation process using a sacrificial layer according to an embodiment of the present invention. As described below, the sacrificial layer counteracts the propensity of GaN-based materials to decompose at high temperatures. Referring to FIG. 6A, a sacrificial layer 602 is formed on the substrate 601 prior to the ion-implantation process. In the illustrated embodiment, a sacrificial layer 602 is formed (e.g., as a uniform layer) on the n-type doped GaN substrate 601. The sacrificial layer 602 can be one of several suitable layers that prevent decomposition of the substrate, including AlN, AlGaN, GaN, alloys thereof, AlSiN, combinations thereof, of the like. Typical thicknesses for the sacrificial layer range from about 1 nm to about 200 nm depending on the particular embodiment. Deposition processes can be used to form the sacrificial layer at a thickness that enables ion-implantation through the sacrificial layer while still protecting the surface during the subsequent anneal process. An ion-implantation process is used to implant acceptor species 603 through the sacrificial layer in a predetermined portion of the substrate. The thickness of the sacrificial layer is selected to not significantly adversely affect the implantation process since the sacrificial layer has a high quality interface with the GaN substrate and protects the underlying sample due to the thermal stability of the sacrificial layer. An implant mask can be utilized as illustrated in FIG. 5A.

Figure 6B:
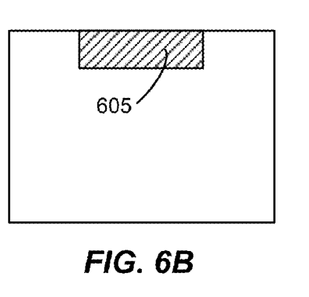

An anneal process is then performed to form annealed p-type region 605. The anneal can be performed in an ambient including a nitrogen precursor (e.g., ammonia) or in an ambient without a nitrogen precursor. Alternatively, because the sacrificial layer serves to protect the underlying substrate from decomposition during the anneal process, other embodiments utilize the superior thermal stability of the sacrificial layer to protect the substrate during anneal and do not use a nitrogen-rich ambient environment. The sacrificial layer can then be removed to expose the substrate surface. As illustrated in FIG. 6B, lateral p-n junctions can thus be formed using this implantation process utilizing a sacrificial layer.

Figure 7A:
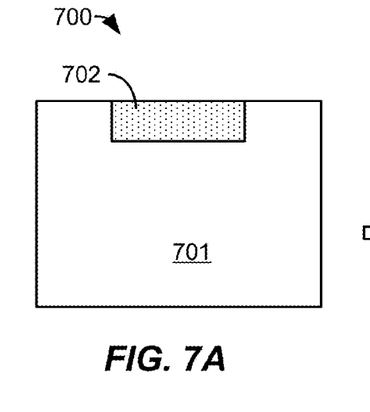
FIGS. 7A-7C are simplified process flow diagrams illustrating an ion implantation process using a sacrificial layer according to another embodiment of the present invention.

FIGS. 7A-7C are simplified process flow diagrams illustrating an ion implantation process using a sacrificial layer according to another embodiment of the present invention. Referring to FIG. 7A, an ion-implantation process is used to form implanted region 702 in substrate 701. An implant mask may be used as illustrated in FIG. 5A. In some implantation processes, the implantation process can damage the sacrificial layer. Accordingly, this embodiment forms the sacrificial layer on the n-type GaN substrate surface after the implantation process, providing a high quality sacrificial layer in advance of the anneal process.

Figure 7B:
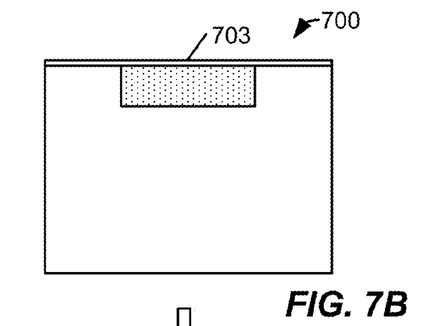
Figure 7C:
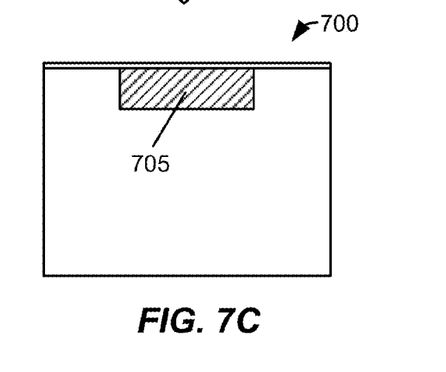

As illustrated in FIG. 7B, after the implantation process, sacrificial layer 703 is added to provide a layer covering the implanted region 702 that is suitable for suppressing decomposition during annealing. Sacrificial layers suitable for use in the process illustrated in FIGS. 6A-6B are typically suitable for use in this embodiment (e.g., AlN, AlGaN, combinations thereof, and the like). An anneal process is then performed to form annealed p-type region 705. The anneal can be performed in an ambient including a nitrogen precursor (e.g., ammonia) or in an ambient without a nitrogen precursor. The sacrificial layer serves to protect the underlying substrate from decomposition during the anneal process. The sacrificial layer can then be stripped to expose the substrate surface. As illustrated in FIG. 7C, lateral p-n junctions can thus be formed using this implantation process utilizing a sacrificial layer formed after the ion-implantation process.

In the embodiments illustrated in FIGS. 3A-7C, the p-type regions are co-doped since both n-type dopants present in the original substrate as well as the p-type dopants are present. In the p-type regions, the doping is net p-type with the acceptors compensating all the donors and providing additional acceptors to result in a net p-type region. These embodiments contrast with regrowth techniques in which only a single dopant type (acceptor or donor) is present in the regrown layers. In some embodiments, the substrate into which the dopant species are implanted or diffused is an undoped substrate, providing for p-type or n-type regions that are not co-doped. One of ordinary skill in the art would recognize many variations, modifications, and alternatives.

Figure 8:
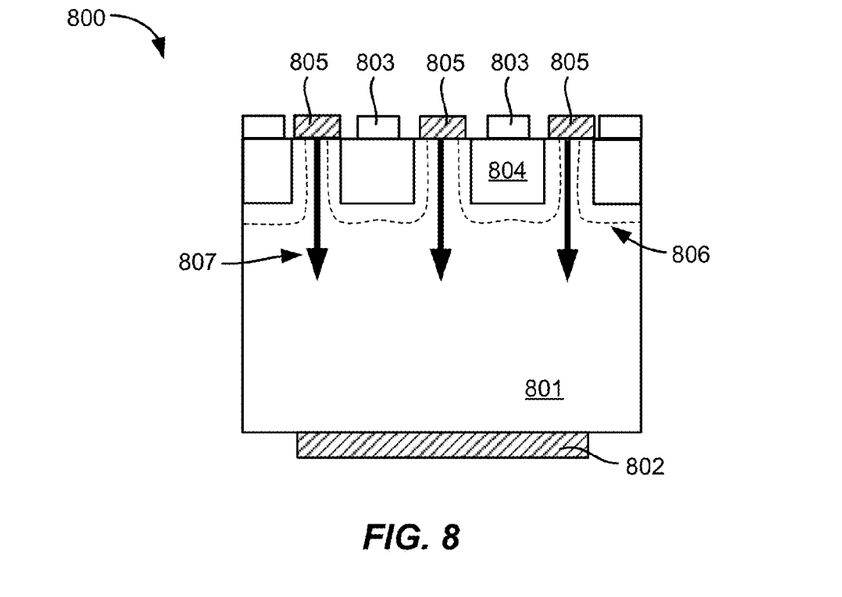
FIG. 8 is a simplified schematic diagram of a vertical junction field effect transistor according to an embodiment of the present invention.

FIG. 8 is a simplified schematic diagram of a vertical junction field effect transistor 800 according to an embodiment of the present invention. The illustrated vertical JFET includes an array of lateral p-n junctions formed in a GaN-based material and is useful for high-power switching applications among other uses. The GaN vertical JFET includes an n-type-doped GaN substrate 801 and an ohmic contact 802 electrically connected to the n-type-doped GaN substrate. A plurality of p-type doped GaN regions 804 are provided in contact with GaN substrate and are used as gate regions as described more fully below. Thus, the vertical JFET includes an array of lateral p-n junctions formed in GaN at locations between and below the p-type doped GaN regions 804. In the illustrated embodiment, the p-type GaN regions 804 are embedded in the n-type GaN substrate 801 as stripes extending into the plane of the figure. The p-type GaN regions 804 can be formed using the diffusion and/or implantation processes described herein.

Each p-type GaN region 804 has an ohmic contact electrode 803. In order to provide a third terminal, ohmic contacts 805 are also formed in electrical contact with the n-type GaN material at locations interspersed between the p-type GaN regions. Thus ohmic contacts 802, 803, and 805 are provided for the source, gate, and drain, respectively, of the three terminal vertical JFET.

As illustrated in FIG. 8, the edge of depletion regions 806 associated with the lateral p-n junctions is shown as separated, allowing current 807 to flow through the vertical channels between adjacent p-type GaN regions 804 when the device is in the "on" state. By applying a bias between the n-contacts 805 and the broad-area n-type contact 802, current 807 flows in the vertical channels disposed between each p-type GaN region 804. Because GaN is characterized by excellent electron mobility and thermal conductivity, the magnitude of the current may be large, providing benefits for high power operation. The vertical current flow 807 can be modulated by increasing and decreasing the channel width between the lateral p-n junctions in response to the bias applied to the p-type electrodes 803 (i.e., gates) with respect to the n-type electrodes 805 (drains). Specifically, as reverse bias is applied across the lateral junctions, the depletion region 806 may be modulated. For a sufficient reverse bias, the vertical current flow 807 may be decreased to zero as the channel is pinched off (i.e., the depletion regions 806 from adjacent lateral p-n junctions are touching, reducing the number of available free carriers towards zero. Additional description related to vertical JFETs is provided in U.S. patent application Ser. Nos. 13/198,655 and 13/198,659, both filed on Aug. 4, 2011, the disclosures of which are hereby incorporated by reference in their entirety.

Figure 9:
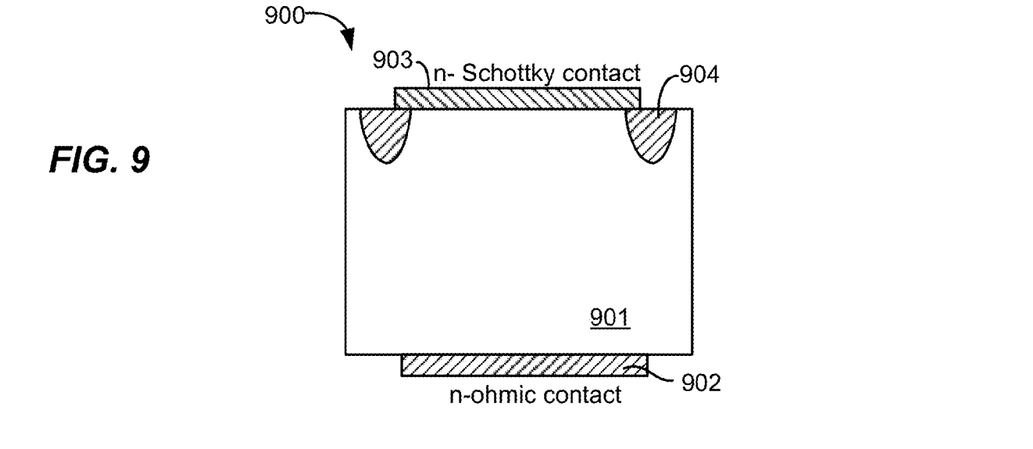
FIG. 9 is a simplified schematic diagram of a Schottky barrier diode according to an embodiment of the present invention.

In addition to three-terminal devices, the performance and reliability of fundamental device structures such as p-n junctions and diodes can be improved using the lateral p-n junction formation techniques described herein. FIG. 9 is a simplified schematic diagram of a Schottky barrier diode according to an embodiment of the present invention. The Schottky barrier diode illustrated in FIG. 9 includes a p-type guard ring 904 formed using the diffusion and/or implantation processes described herein. The Schottky barrier diode 900 includes a lightly n-type doped GaN substrate 901, an ohmic contact 902 to the n-type doped GaN substrate, and an n-Schottky contact 903. The p-type guard ring 904 reduces the electric fields at the edges of the Schottky contact, improving system performance. Additional discussion related to guard rings is provided in U.S. patent application Ser. No. 13/270,606, filed Oct. 11, 2011, the disclosure of which is hereby incorporated by reference in its entirety.

Figure 10:
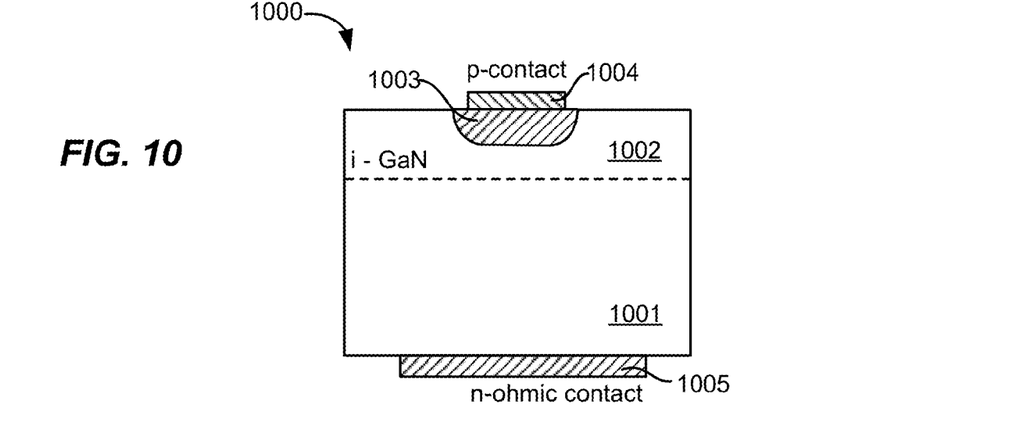
FIG. 10 is a simplified schematic diagram of a p-i-n diode according to an embodiment of the present invention.

FIG. 10 is a simplified schematic diagram of a p-i-n diode according to an embodiment of the present invention. The p-i-n diode 1000 includes an n-type doped GaN substrate 1001, an n-ohmic contact 1005, and an intrinsic or n-type GaN layer 1002. A locally diffused or implanted p-type doped GaN region 1003 is formed using the diffusion and/or implantation processes described herein, forming the p-region of the diode in contact with a p-electrode 1004. The small-area p-i-n junction illustrated in FIG. 10 provides a device characterized by lower capacitance and a low leakage current than conventional devices, rendering the p-i-n diode suitable for detector applications.

Figure 11:
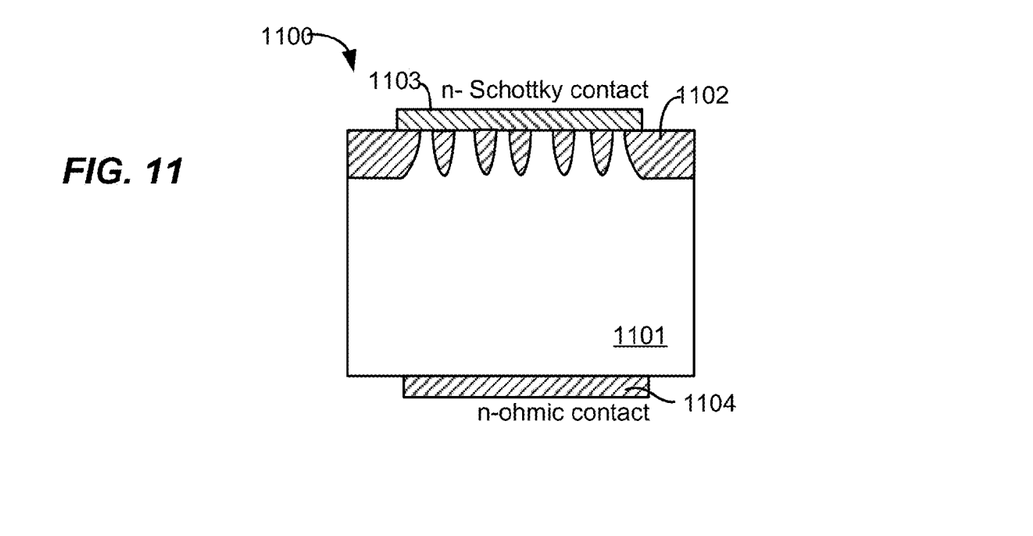
FIG. 11 is a simplified schematic diagram of a junction barrier Schottky diode according to an embodiment of the present invention.

FIG. 11 is a simplified schematic diagram of a junction barrier Schottky (JBS) diode 1100 according to an embodiment of the present invention. The JBS diode includes an n-type doped GaN substrate 1101 with locally diffused or implanted p-type doped GaN regions 1102 fabricated using embodiments of the present invention. A n-Schottky contact 1103 is formed in contact with the p-type doped regions 1102 and an ohmic contact 1104 to the n-type doped GaN substrate is utilized. It should be noted that the use of the diffusion and/or implantation processes described herein to form the p-type regions 1102 underneath the n-Schottky contact 1103 enable device performance that is greatly improved in comparison with conventional devices fabricated using damaging processes including etch and re-growth.

In addition to the particular devices illustrated in FIGS. 8-11, other electronic devices can utilize the diffused or implanted regions described herein. These devices include HEMTs, BJTs, p-n junction detectors, and the like. One of ordinary skill in the art would recognize many variations, modifications, and alternatives.

Figure 12:
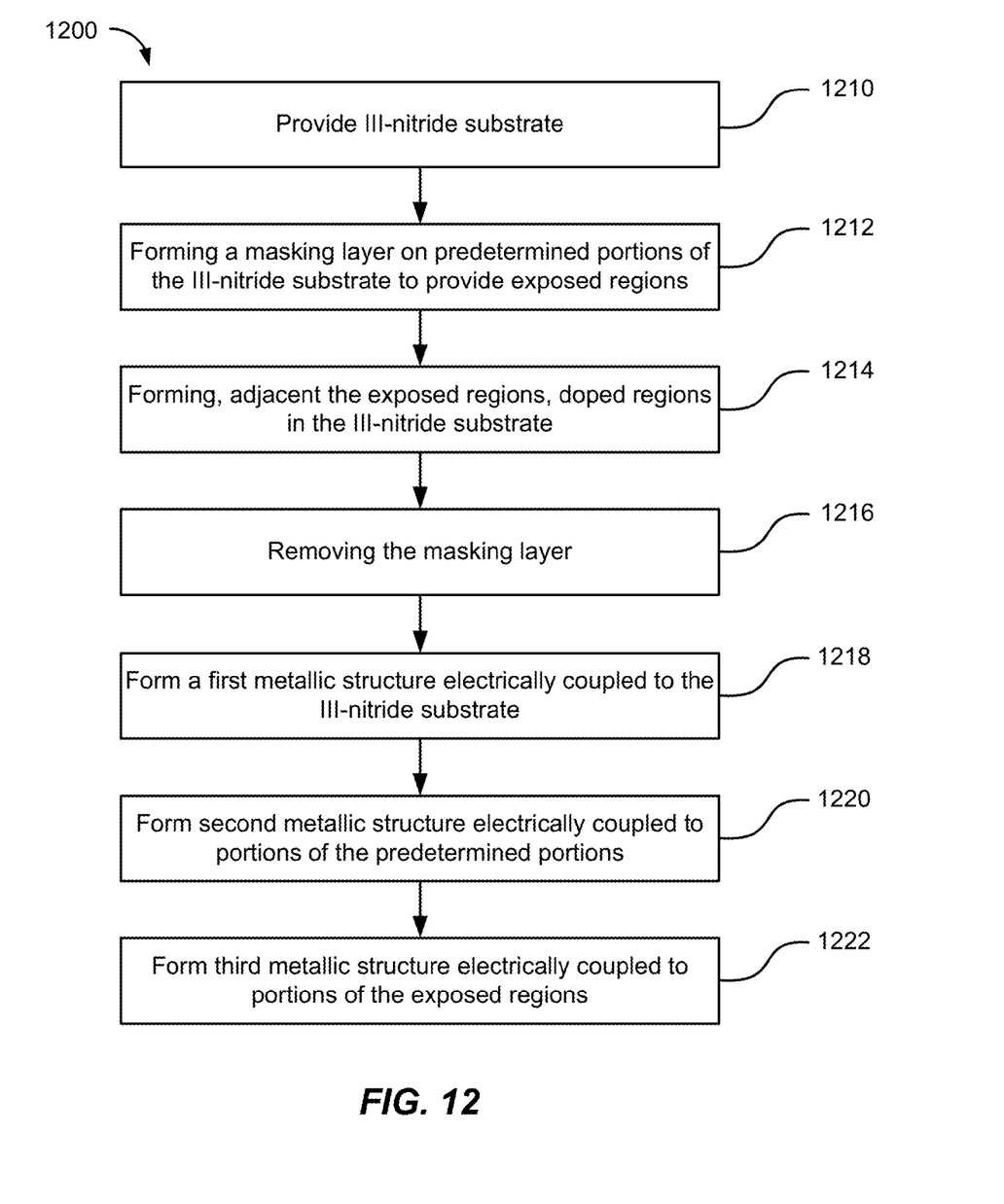
FIG. 12 is a simplified flowchart illustrating a method of fabricating a vertical junction field effect transistor according to an embodiment of the present invention.

FIG. 12 is a simplified flowchart illustrating a method of fabricating a vertical junction field effect transistor according to an embodiment of the present invention. The method 1200 includes providing a III-nitride substrate, for example, an n-type GaN substrate (1210). The method also includes forming a masking layer on predetermined portions of the III-nitride substrate (1212). The formation of the masking layer, which may include sub-layers, adhesion layers, and the like, will define exposed regions of the III-nitride substrate. Implantation and/or diffusion processes are then utilized to form, adjacent to the exposed regions, doped regions in the III-nitride substrate (1214). The implantation and anneal processes can utilize any of the processes described herein. In an embodiment, combinations of the various processes can be utilized, for example, use of a sacrificial layer in conjunction with the masking layer as part of the ion implantation and annealing process. In some embodiments, the anneal is performed in an MOCVD reactor as described herein.

The method further includes removing the masking layer (1216). In some embodiments, the masking layer is removed prior to the anneal process following implantation, whereas in other embodiments, it follows the completion of the anneal process. Native oxides and other suitable layers can be removed along with the masking layer. Metallic structures are formed that are electrically coupled to the substrate (1218), the predetermined portions (1220), and the exposed regions (1222). Thus, ohmic contacts are provided to the bottom of the substrate (Drain), the top of the substrate (Source), and the p-type regions 804 illustrated in FIG. 8 (Gate) of the JFET.

It should be appreciated that the specific steps illustrated in FIG. 12 provide a particular method of fabricating a vertical junction field effect transistor according to an embodiment of the present invention. Other devices can also be fabricated using the methods described in relation to FIG. 12 as well as throughout the present specification. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of forming a doped region in a III-nitride substrate, the method comprising:
providing the III-nitride substrate, wherein the III-nitride substrate is characterized by a first conductivity type;
forming a masking layer having a predetermined pattern, wherein the predetermined pattern defines exposed regions of the III-nitride substrate;
placing the exposed regions of the III-nitride substrate in a dual-precursor gas comprising both a chemically reactive nitrogen source and a dopant source;
while the exposed regions of the III-nitride substrate are exposed to the chemically reactive nitrogen source and the dopant source of the dual-precursor gas, implanting the dopant from the dopant source of the dual-precursor gas into the exposed regions of the III-nitride substrate, wherein, while the dopant is implanted into the exposed regions, the chemically reactive nitrogen source counteracts the effects of nitrogen escaping from the III-nitride substrate; and
removing the masking layer.

2. The method of claim 1, wherein the III-nitride substrate comprises an n-type GaN substrate.

3. The method of claim 1, wherein the masking layer comprises a refractory material.

4. The method of claim 1, wherein a temperature of the dual-precursor gas is between about 800° C. to about 1800° C.

5. The method of claim 1, wherein the dual-precursor gas includes ammonia and an acceptor species.

6. The method of claim 1, wherein placing the exposed regions of the III-nitride substrate in the dual-precursor gas comprises:
    positioning the III-nitride substrate in a chamber; and
    flowing the dual-precursor gas including both the nitrogen source and the dopant source through the chamber.

7. The method of claim 5, wherein the chamber comprises an MOCVD chamber.

8. The method of claim 1, wherein implanting the dopant into the III-nitride substrate comprises diffusing the dopant into the III-nitride substrate.

9. A method of forming a doped region in a III-nitride substrate, the method comprising:
    providing the III-nitride substrate, wherein the III-nitride substrate is characterized by a first conductivity type;
    forming a masking layer having a predetermined pattern, wherein the predetermined pattern defines predetermined portions of the III-nitride substrate;
    placing the III-nitride substrate in a chamber;
    forming an environment in the chamber, wherein the environment comprises a dual-precursor gas including both a chemically reactive nitrogen source and a dopant source, wherein the dopant is characterized by a second conductivity type;
    exposing the predetermined portions of the III-nitride substrate to the chemically reactive nitrogen source and the dopant source of the dual-precursor gas;
    while the predetermined portions of the III-nitride substrate are exposed to the chemically reactive nitrogen source and the dopant source of the dual-precursor gas, implanting the dopant into the predetermined portions of the III-nitride substrate;
    while the predetermined portions of the III-nitride substrate are exposed to the chemically reactive nitrogen source, with the chemically reactive nitrogen source, counteracting the effects of nitrogen escaping from the III-nitride substrate; and
    removing the masking layer.

10. The method of claim 9, wherein the chamber comprises an MOCVD reactor.

11. The method of claim 9, wherein the chamber comprises an annealing furnace.

12. The method of claim 9, wherein the III-nitride substrate comprises an n-type GaN substrate.

13. The method of claim 9, wherein the masking layer comprises a refractory material.

14. The method of claim 9, wherein removing the masking layer is performed prior to placing the III-nitride substrate in the chamber.

15. The method of claim 9, wherein a temperature of the environment is between about 800° C. to about 1800° C.

16. The method of claim 9, wherein the dopant comprises an acceptor species.

17. The method of claim 9, further comprising forming a sacrificial layer coupled to the III-nitride substrate prior to implanting the dopant.

18. The method of claim 17, further comprising removing the sacrificial layer is performed after implanting the dopant.

19. The method of claim 9, wherein implanting the dopant into the III-nitride substrate comprises performing an ion implantation process.

20. The method of claim 9, wherein implanting the dopant into the III-nitride substrate comprises diffusing the dopant into the III-nitride substrate.

* * * * *